United States Patent [19]

Ohnuma

[11] Patent Number: 5,792,581
[45] Date of Patent: Aug. 11, 1998

[54] METHOD OF CORRECTING PATTERN DATA FOR DRAWING PHOTOMASK TO OVERCOME PROXIMITY EFFECTS

[75] Inventor: Hidetoshi Ohnuma, Kanagawa, Japan

[73] Assignee: Sony Corporation, Japan

[21] Appl. No.: 681,524

[22] Filed: Jul. 23, 1996

[30] Foreign Application Priority Data

Aug. 1, 1995 [JP] Japan ................................ 7-196898

[51] Int. Cl.$^6$ ................................................ G03C 5/00
[52] U.S. Cl. ........................... 430/30; 430/5; 430/296
[58] Field of Search .............................. 430/5, 30, 296

[56] References Cited

U.S. PATENT DOCUMENTS

| | | | |
|---|---|---|---|
| 5,254,438 | 10/1993 | Owen et al. | 430/30 |
| 5,432,714 | 7/1995 | Chung et al. | 430/30 |
| 5,667,923 | 9/1997 | Kanata | 430/30 |

*Primary Examiner*—Christopher G. Young
*Attorney, Agent, or Firm*—Ronald P. Kananen

[57] ABSTRACT

A correcting method and a correcting apparatus which consider a proximity effect when drawing a pattern of a photomask by an energy beam such as an electron beam or a light proximity effect when performing exposure by using a photomask and obtaining a transfer pattern and can correct the pattern data so that the finally obtained transfer pattern becomes close to the designed pattern even if they occur. Where there is another pattern at the periphery of a pattern in a certain mesh at a center which is subjected to mesh registration, it is decided that a mutual proximity effect will occur at the time of drawing, only a part of the patterns in which it can be considered that the mutual proximity effect will occur are subdivided, and the dosage amount data at drawing are assigned to individual subdivided patterns. Where there is not another pattern at the periphery, it is decided that the self proximity effect will occur at the time of drawing, the peripheral portions of the pattern in which it can be considered that the self proximity effect will occur are subdivided, and the dosage amount data at drawing are assigned to individual subdivided patterns.

4 Claims, 5 Drawing Sheets

FIG. 1
FIG. 1A
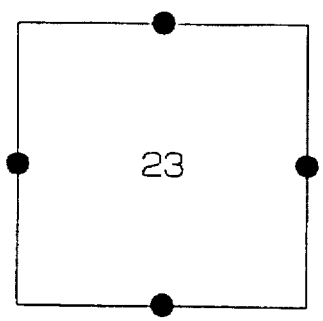
FIG. 1B
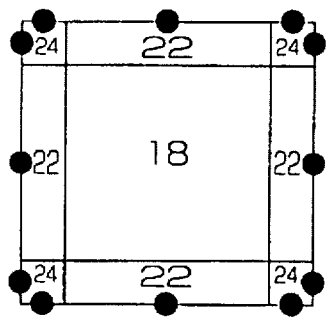
FIG. 2
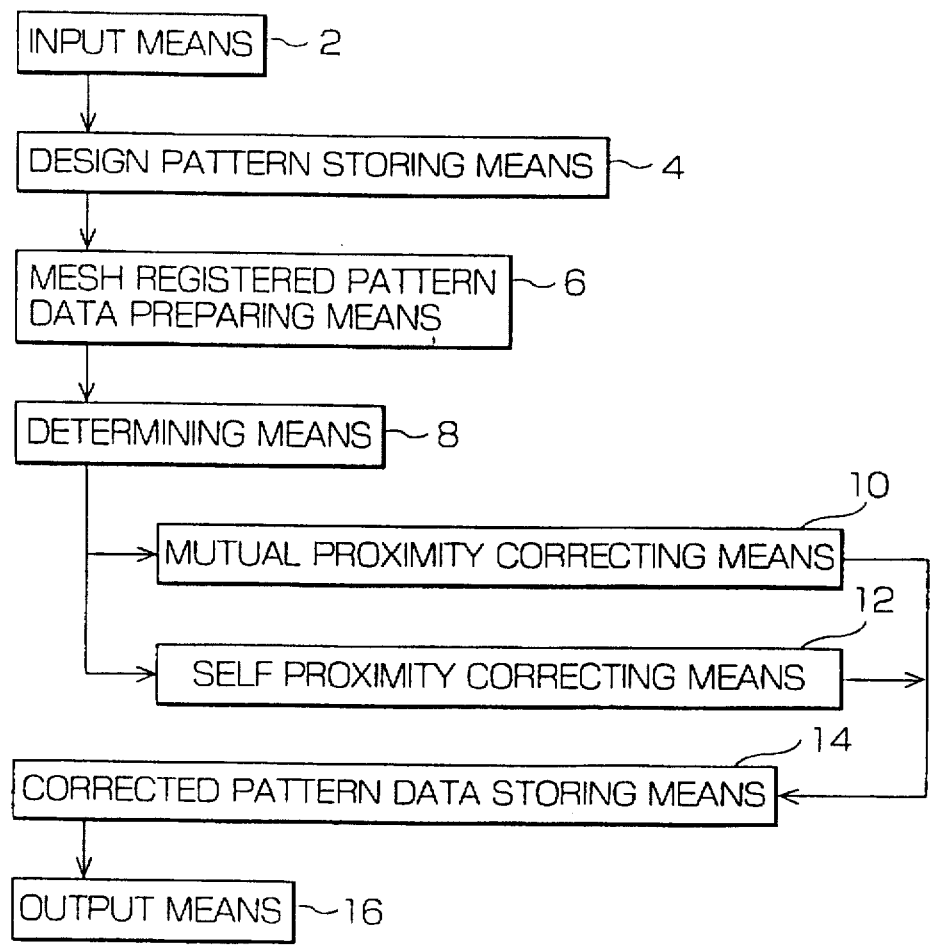

FIG. 8
CORRECTING METHOD
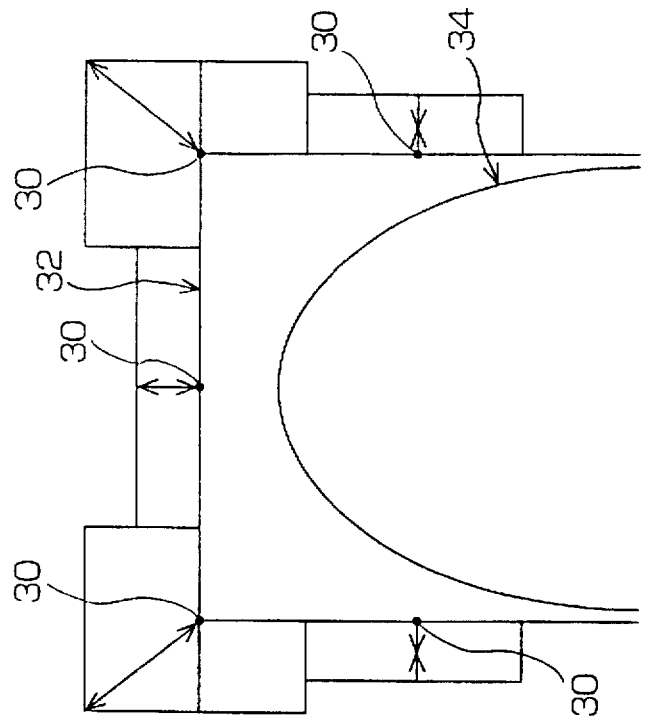
FIG. 8A
MEASURE MAGNITUDE OF DEVIATION OF RESIST EDGE FOR EVERY EVALUATION POINT
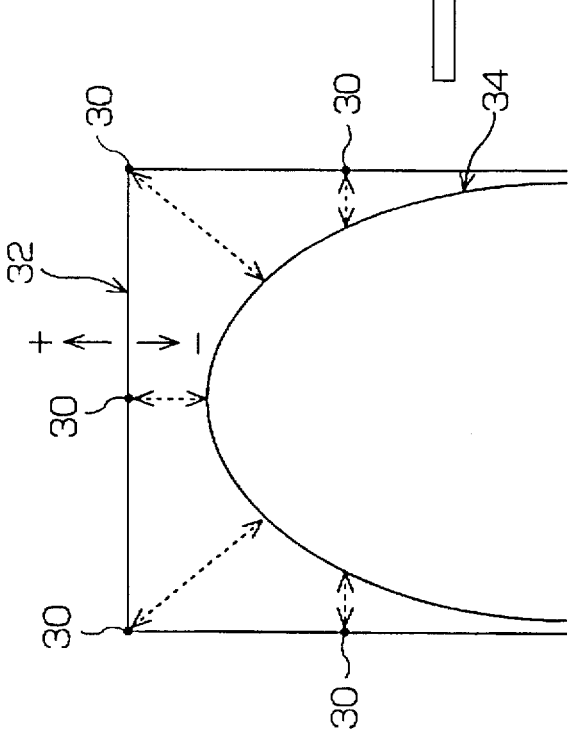
FIG. 8B
MOVE MASK PATTERN EDGE EXACTLY BY A MAGNITUDE OBTAINED BY MULTIPLYING MAGNITUDE OF EDGE DEVIATION BY COEFFICIENT (CAN BE SET)

METHOD OF CORRECTING PATTERN DATA FOR DRAWING PHOTOMASK TO OVERCOME PROXIMITY EFFECTS

BACKGROUND OF THE INVENTION

1. Field of the Invention

The present invention relates to a method of correcting data for drawing a photomask. More particularly, the present invention relates to a method of correcting drawing data of a photomask for pattern transfer used in the process of production of a semiconductor or a method of correcting pattern data for preventing pattern deterioration which occurs at the time of wafer transfer.

2. Description of the Related Art

The photomask used in the process of production of a semiconductor device is constructed as a glass substrate on which a light shielding film is formed. The semiconductor is prepared by projecting and exposing the photomask onto a wafer. First, to form the photomask, it is necessary to convert designed computer-assisted design (CAD) data into data for an electron beam (EB) drawing apparatus and faithfully pattern this.

In EB photolithography, however, it has been known that the phenomenon called as the "proximity effect" governs the limit of the resolution and that it has become a serious problem in the preparation of a photomask for performing fine processing and direct drawing of a wafer. The proximity effect is caused by the scattering of electrons in a solid. The effects thereof can be classified into two types according to the shape of the pattern.

Namely, there are the self-proximity effect seen in an isolated fine pattern and the mutual proximity effect seen between adjoining patterns. In the self-proximity effect, the incident electrons are scattered to the outside of the pattern and consequently the accumulated energy within the design dimensions cannot reach a desired value and as a result the final dimensions becomes small or the corner portions are rounded. Further, in the mutual proximity effect, in a gap between the patterns, the accumulated energy reaches the threshold value due to the scattering of electrons from the patterns of the two sides and contact between patterns etc. occur.

As a method of correcting the EB proximity effect, there has already been proposed for a variable shaping type drawing apparatus the method of varying the amount of irradiation for every pattern figure. In this method, as shown in FIG. 1A, an evaluation point is provided at every pattern edge, the accumulated energy found from an exposure intensity distribution (EID) function is calculated at each evaluation point, and the optimum amount of irradiation to be given to the pattern is determined. Note, in this method, in the vicinity of the evaluation points, the amount of irradiation found when the geometrical arrangement of the adjoining patterns are different differs for every evaluation point, consequently the only thing to do is to determine the weighted average value as the amount of irradiation. In this case, sometimes the precision differs for every evaluation point or the intended precision cannot be guaranteed. In order to prevent this, as shown in FIG. 1B, a method of dividing the pattern data so that the amount of irradiation can be controlled for every evaluation point is adopted.

When finely dividing the pattern data existing in all EB data, however, there arises a problem that all of the correction calculation time, data size, and drawing time are increased and a reduction of the mask preparation thruput is induced.

Further, even if the mask can be correctly patterned, pattern deterioration in the wafer, called the light proximity effect, is caused at the time of exposure. This is a phenomenon where the stepper light passing through the opened mask pattern shape diffracts and interferes and consequently the pattern is not correctly resolved on the wafer surface. The light proximity effect includes the self-light proximity effect and the mutual light proximity effect.

The self-light proximity effect means that, in one's own pattern, the stepper light diffracts and, as a result, the final dimensions of the pattern resolved on the wafer become different and the precision of the final dimensions greatly differs in both of the short side and long side in the rectangular pattern. Further, the mutual proximity effect means that, as a result of interference with the stepper light diffracted from the other patterns, the final dimensions on the wafer become small.

For the correction of this light proximity effect, as shown in for example "Automatched deterioration of CAD layout failures through focus: experiment and simulation" (C. A. Spence et al., Proc. of SPIE, Vol. 2197, pp 302–313), there has already been considered the method of correcting the light proximity effect by deforming the pattern figure so that the image is resolved on the wafer in a desired shape by simulating the light intensity on the evaluation points on the pattern edges similar to the proximity effect correction of EB and while shifting the pattern edges.

Also, at the time of this correction, the pattern must be finely divided for improvement of precision, so there arise serious problems of an increase of the correction calculation time, data transfer load due to an increase of the data size, and even the drawing time in a variable shaping type drawing apparatus, a reduction of the thruput, and consequently a delay of they delivery date of products.

Usually, for about a 64 MDRAM, it is sufficient if ±0.05 micron is achieved in terms of the dimensional precision on the mask, but a dimensional precision of ±0.035 micron is required for about a 256 MDRAM (each dimension is a value on 5 X recticle). In general, for the mask data processing for a 0.5 micron rule device such as 16 MDRAM, two hours per layer is set as a reference. It is necessary to suppress the size of the data to about 100 Mbytes in the EB data for drawing a mask. Even for a 64 MDRAM requiring correction of the proximity effect, an equivalent processing ability is required.

The required dimensional precision when forming a pattern on a wafer by using these masks is ±0.025 micron in a 0.25 micron rule device such as a 64 MDRAM. In this way, in each data correcting processing for improvement of the precision at the time of formation of a mask corrected for the proximity effect in electron beam drawing and for improvement of the precision at the wafer transfer by correcting the light proximity effect by making corrections to the mask pattern, the calculation must be ended in a practical processing time and with a practical data capacity while satisfying the above precision.

In general, the data for configuring a photomask is comprised by data expressed by just an enormous number of rectangles and trapezoids. The target of the present invention is to prepare corrected data by preliminarily considering the physical phenomenon such as drawing and transfer based on the characteristics of this data.

By this, in the processing of the drawing data of a photomask, it is made possible to prevent the thruput from being reduced by an algorithm for deriving the minimum limit of data division at a high speed for correction of data satisfying the precision required by a photomask and a wafer.

SUMMARY OF THE INVENTION

An object of the present invention is to provide a correcting method and a correcting apparatus which consider a proximity effect when drawing a pattern of a photomask by an energy beam such as an electron beam or a light proximity effect when performing exposure by using a photomask and obtaining a transfer pattern and can correct the pattern data so that the finally obtained transfer pattern becomes close to the designed pattern even if they occur.

The present invention provides as a method for processing drawing data of a photomask characterized by using a data base of mesh-registered pattern data to search for periphery data which the mutual proximity effect reaches and a fine pattern where the self-proximity effect occurs at a high speed and automatically subdividing only the portion at which the influence of the proximity effects is conspicuous so as to reduce the correction calculations by the minimum limit of data division and also suppress the amount of data.

That is, a method of correcting pattern data for drawing a photomask according to a first aspect of the present invention comprises a preparing step for dividing a design pattern into meshes by a size of a range scattering an energy beam when drawing an image by the energy beam and thereby preparing mesh-registered pattern data; a determining step for taking note of a mesh at the center and searching inside the mesh, including, the mesh periphery, to determine whether or not another pattern is registered at the periphery of the pattern registered for the mesh at the center; and a mutual proximity effect correcting step for deciding that a mutual proximity effect occurs at the time of drawing when there is another pattern at the periphery in the determining step, subdividing only a part of the patterns in which it can be considered that the mutual proximity effect occurs, and assigning dosage amount data at the time of drawing to the respective subdivided patterns.

A correcting method according to a second aspect of the present invention comprises a preparing step for dividing a design pattern into meshes by a size of a range scattering an energy beam when drawing an image by the energy beam and thereby preparing mesh-registered pattern data; a determining step for taking note of a mesh at the center and searching inside the mesh, including, the mesh periphery, to determine whether or not another pattern is registered at the periphery of the pattern registered for the mesh at the center; and a self-proximity effect correcting step for deciding that a self proximity effect occurs at the time of drawing when there is no other pattern at the periphery in the determining step, subdividing only a part of the patterns in which it can be considered that the self proximity effect occurs, and assigning dosage amount data at the time of drawing to the respective subdivided patterns.

A correcting method according to a third aspect of the present invention comprises a preparing step for dividing a design pattern into meshes by a size of a range considering the light proximity effect at the time when performing the exposure and transferring the image onto a substrate and thereby preparing mesh-registered pattern data; a determining step for taking note of a mesh at the center and searching inside the mesh, including, the mesh periphery, to determine whether or not another pattern is registered at the periphery of the pattern registered for the mesh at the center; and a mutual proximity effect correcting step for deciding that the mutual light proximity effect occurs at the time of exposure when there is another pattern at the periphery in the determining step, subdividing only a part of the patterns in which it can be considered that the mutual light proximity effect occurs, and moving the edges of the subdivided patterns so that the transfer image becomes closer to the design pattern.

A correcting method according to a fifth aspect of the present invention comprises a preparing step for dividing a design pattern into meshes by a size of a range considering the light proximity effect at the time when performing the exposure and transferring the image onto a substrate and thereby preparing mesh-registered pattern data; a determining step for taking note of a mesh at the center and searching inside the mesh, including, the mesh periphery, to determine whether or not another pattern is registered at the periphery of the pattern registered for the mesh at the center; and a self-proximity effect correcting step for deciding that the self light proximity effect occurs at the time of exposure when there is no other pattern at the periphery in the determining step, subdividing the peripheral portions of the patterns in which it can be considered that the self light proximity effect occurs, and moving the edges of the subdivided patterns so that the transfer image becomes closer to the design pattern.

A photomask according to a sixth aspect of the present invention has a pattern drawn by using data corrected by using the method of correcting a pattern data for drawing a photomask.

An exposure method according to a seventh aspect of the present invention is a method for performing exposure by using the above photomask.

A semiconductor device according to an eighth aspect of the present invention is a semiconductor device produced by performing photolithographic processing by using a photomask having a pattern drawn by using data corrected by using any of the above correcting methods of pattern data.

A correcting apparatus according to a ninth aspect of the present invention comprises a preparing means for dividing a design pattern into meshes by a size of a range scattering an energy beam when drawing an image by the energy beam and thereby preparing mesh-registered pattern data; a determining means for taking note of a mesh at the center and searching inside the mesh, including, the mesh periphery, to determine whether or not another pattern is registered at the periphery of the pattern registered for the mesh at the center; and a mutual proximity effect correcting means for deciding that a mutual proximity effect occurs at the time of drawing when the determining means finds there is another pattern at the periphery, subdividing only a part of the patterns in which it can be considered that the mutual proximity effect occurs, and assigning dosage amount data at the time of drawing to the respective subdivided patterns.

A correcting apparatus according to a 10th aspect of the present invention comprises a preparing means for dividing a design pattern into meshes by a size of a range scattering an energy beam when drawing an image by the energy beam and thereby preparing mesh-registered pattern data; a determining means for taking note of a mesh at the center and searching inside the mesh, including, the mesh periphery, to determine whether or not another pattern is registered at the periphery of the pattern registered for the mesh at the center; and a self proximity effect correcting means for deciding that a self proximity effect occurs at the time of drawing when the determining means does not find another pattern at the periphery, subdividing only a part of the patterns in which it can be considered that the self proximity effect occurs, and assigning dosage amount data at the time of drawing to the respective subdivided patterns.

A correcting apparatus according to an 11th aspect of the present invention comprises a preparing means for dividing a design pattern into meshes by a size of a range considering the light proximity effect at the time when performing the exposure and transferring the image onto a substrate and thereby preparing mesh-registered pattern data; a determining means for taking note of a mesh at the center and searching inside the mesh, including, the mesh periphery, to determine whether or not another pattern is registered at the periphery of the pattern registered for the mesh at the center; and a mutual proximity effect correcting means for deciding that the mutual light proximity effect occurs at the time of exposure when the determining step finds another pattern at the periphery, subdividing only a part of the patterns in which it can be considered that the mutual light proximity effect occurs, and moving the edges of the subdivided patterns so that the transfer image becomes closer to the design pattern.

A correcting apparatus according to a 12th aspect of the present invention comprises a preparing means for dividing a design pattern into meshes by a size of a range considering the light proximity effect at the time when performing the exposure and transferring the image onto a substrate and thereby preparing mesh-registered pattern data; a determining means for taking note of a mesh at the center and searching inside the mesh, including, the mesh periphery, to determine whether or not another pattern is registered at the periphery of the pattern registered for the mesh at the center; and a self proximity effect correcting means for deciding that the self light proximity effect occurs at the time of exposure when the determining step does not find another pattern at the periphery, subdividing the peripheral portions of the patterns in which it can be considered that the self light proximity effect occurs, and moving the edges of the subdivided patterns so that the transfer image becomes closer to the design pattern.

An apparatus for production of a photomask according to a 13th aspect of the present invention has any of the above apparatuses for correcting pattern data for drawing a photomask and a drawing means for drawing a photomask of a mask pattern corrected by the correcting apparatus.

An apparatus for production of a semiconductor device according to a 14th aspect of the present invention has an apparatus for correcting pattern data for drawing a photomask and an exposing means for performing exposure by using a photomask of a mask pattern corrected by the correcting apparatus.

In the present invention, in the production of a semiconductor integrated circuit pattern, by performing the minimum limit of division processing for making the correction most effective in accordance with the proximity effect of the EB photolithography and the light proximity effect of the result of wafer transfer, the correction calculation time, drawing time, and data size are suppressed and a finely processed mask and wafer can be prepared without a reduction of the thruput for the preparation of photomask.

In the present invention, the preparation of the data for preparing a mask or wafer having an intended precision becomes possible without a reduction of thruput for the preparation of the mask.

BRIEF DESCRIPTION OF THE DRAWINGS

These and other objects and features of the invention will become clearer from the following explanation of the preferred embodiments given with reference to the attached drawings, in which:

FIGS. 1A and 1B are views of evaluation points in correction of the proximity effect by the system of correction of the amount of dosage;

FIG. 2 is a schematic block diagram of a correcting apparatus according to one embodiment of the present invention;

FIG. 8A is a schematic view of a method for measuring deviation of the resist edge for every evaluation point;

FIG. 8B is a schematic view showing a correction deformation step of the mask pattern;

DESCRIPTION OF THE PREFERRED EMBODIMENTS

Figure 3:
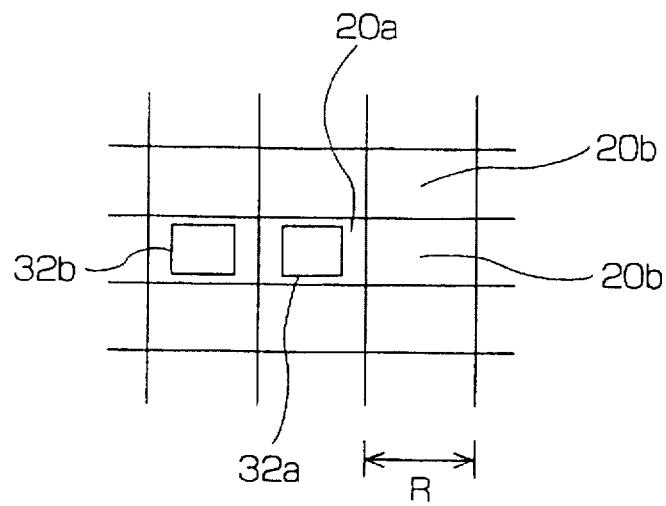
FIG. 3 is a conceptual view of a mesh.

Below, an explanation will be made of embodiments of the present invention. Of course, the present invention is not limited to the embodiments mentioned below.

First Embodiment

A schematic block diagram of an apparatus for correcting pattern data according to the present embodiment is shown in FIG. 2.

As shown in FIG. 2, a pattern data correcting apparatus according to a first embodiment has an input means 2, a design pattern storing means 4, a mesh-registered pattern data preparing means 6, a determining means 8, a mutual proximity correcting means 10, a self-proximity correcting means 12, a corrected pattern data storing means 14, and an output means 16.

The input means 2 is not particularly limited so far as it can receive as input the design pattern, transfer conditions, etc. A keyboard, a touch panel, etc. can be mentioned. Where the design pattern, transfer conditions, etc. are input in the form of an electric signal, the input means 2 can be a wired or wireless input terminal. Further, where a design pattern, transfer conditions, etc. stored in a recording medium such as a floppy disk are input, the input means 2 is constituted by a disk drive etc.

Further, as the output means 16, a CRT, a liquid crystal display device, etc. which can display at least the corrected design pattern on a screen can be used. Further, as the output means 16, it is also possible to adopt an output means such as a printer, XY plotter, etc. which can draw at least the corrected design pattern on paper, film, or other substrates.

The other means 4, 6, 10, 12, and 14 shown in FIG. 2 are constituted by program information stored in storing means such as a processing circuit or a RAM, ROM, optical storage medium, etc. and processed by the CPU of a computer etc.

In the first embodiment, the design pattern and the transfer conditions are stored from the input means 2 shown in FIG. 2 in the design pattern storing means 4 of the correcting apparatus. The transfer conditions are the conditions concerning for example the wavelength $\lambda$ of light used for exposure, numerical aperture NA, apparent size a of the light source (partial coherence), or distribution of the transmission rate of the light source, phase and transmission distribution of the exit pupil and defocus, etc.

The design pattern stored in the design pattern storing means 4 is divided into meshes by the mesh-registered data preparing means 6. The size of the mesh is within a range where for example the electron beam is scattered at the time of the drawing by the electron beam. Namely, when the distance which the proximity effect reaches is defined as R, the pattern data is registered in a mesh of the size of R. The size of mesh as one example is about 5 to 10 μm.

In the determining means 8 shown in FIG. 2, attention is paid to a certain mesh at a center of the mesh-registered data prepared in the pattern data preparing means 6, a search is carried out inside the mesh, including the periphery of that mesh, and it is determined whether or not other patterns are registered at the periphery of the pattern registered in the mesh at the center. For example, as shown in FIG. 3, when attention is paid to a pattern 32a in a certain mesh 20a at the center, attention is paid to a pattern 32b existing in a mesh 20b in the range of R around that pattern 32a. If no pattern exists in that range, it is sufficient if only the self-proximity effect is considered when performing the correction calculation for that pattern. In that case, the correction is carried out by using the self-proximity correcting means 12 shown in FIG. 2.

Further, as shown in FIG. 3, where the pattern 32b exists around that pattern 32a, it is necessary to consider the mutual proximity. Attention is paid to the vicinity of this, and only that portion is divided. In that case, the correction is carried out by using the mutual proximity correcting means 12 shown in FIG. 2. The data subjected to the mesh registration is sequentially searched for example for every nine measures.

The contents of the processing of the mutual proximity correcting means 10 and the self-proximity correcting means 12 will be mentioned later. The data corrected by these correcting means are stored in the corrected pattern data storing means 14 shown in FIG. 2. The data stored in this storing means 14 are output from the output means 16.

First, an explanation will be made of the self proximity correcting means 12 for EB. In the self proximity correcting means 10 for EB, where it is decided by the determining means 8 shown in FIG. 2 that the pattern data is data suffering from the self proximity effect, only the correction of the self proximity effect is carried out with respect to that pattern. At the correction, the pattern is subdivided. Also the position of the evaluation point at that time and the method of division depending upon this are considered only within a range of the self proximity effect.

Figure 4:
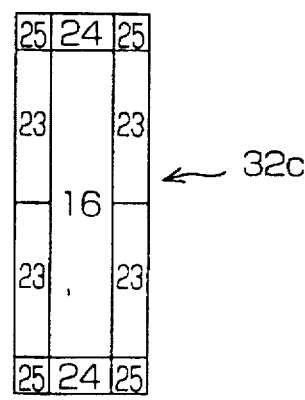
FIG. 4 is a view of an example of division of a pattern for correction of a self proximity effect.

FIG. 4 shows an example of a division (subdivision) and an amount of irradiation (amount of dosage) as a result of correcting the self proximity effect with respect to fine pattern data 32c corresponding to a 256 MDRAM. The numerals in FIG. 4 indicate an amount of dosage in the respective subdivided patterns. Where there is an apprehension of occurrence of the self proximity effect, the peripheral portion of that pattern is subdivided, and the amount of dosage on the periphery is made high with respect to the amount of dosage at the center portion. Particularly the amount of dosage at the angle portion is made high.

Next, an explanation will be made of the mutual proximity correcting means 10 for EB.

In the mutual proximity correcting means 10 for EB, where it is decided by the determining means 8 shown in FIG. 2 that the pattern data is data suffering from the mutual proximity effect, the mutual proximity effect is corrected only for the related sides of the adjoining patterns. If there is no adjoining pattern, only the self proximity effect correction is considered for the other sides.

Figure 5:
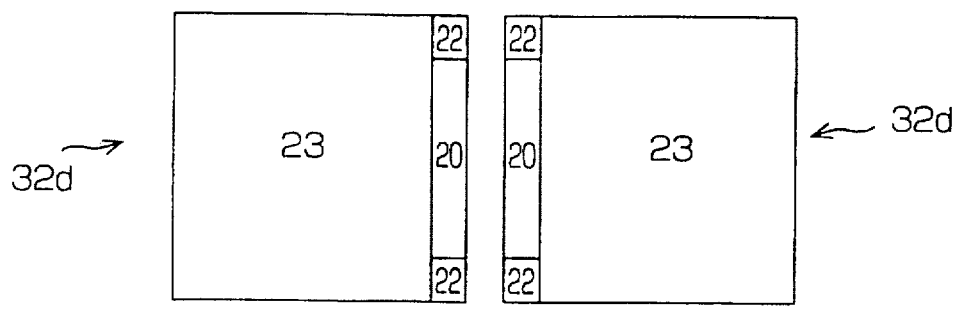
FIG. 5 is a view of an example of division of a pattern for correction of a mutual proximity effect.

FIG. 5 is a view showing an example of the division (subdivision) and the amount of irradiation (amount of dosage) as a result of correcting the mutual proximity effect for the related sides of the fine pattern data 32d and 32d corresponding to a 256 MDRAM. The numerals in FIG. 5 indicate the amount of dosage in the respective subdivided patterns. Where there is an fear of occurrence of the mutual proximity effect, the related side of that pattern is subdivided and the amount of dosage at the related side is made higher with respect to the amount of dosage at the center portion. Particularly, the amount of dosage at the corner portions is made higher than that at the center of the related side.

In the correcting method using the correcting apparatus of the embodiment, the patterns considered are only the patterns registered in the mesh in the vicinity of the position at which the correction calculation is now started, therefore a short calculation time is sufficient. For example, when assuming that n number of patterns exist in a square having a length of one side of L, n*n number of searches are necessary for searching the adjoining patterns, but when searching by registering patterns in meshes having a size of R, the number of times required for the search of the mesh becomes $(L*L)/(R*R)$ and the number of times required for the search of the pattern in the corresponding mesh becomes $((R*R)/(L*L)*n)**2$. From this, the number of times required for a search using meshes becomes $(R*R)/(L*L)*n*n$, but when a sufficiently large n is taken, L*L becomes the same degree as n, and it is seen that the search can be carried out by an order of n number of times.

Figures 6, 7:
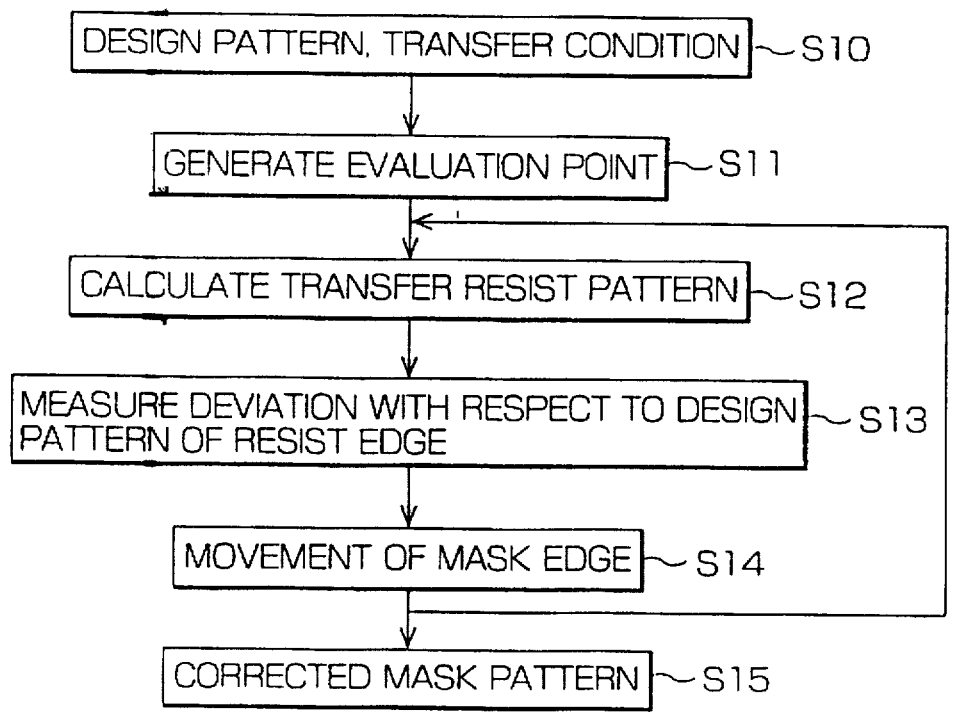
FIG. 6 is a view of a simple pattern division.
FIG. 7 is a view of a pattern requiring correction of the light proximity effect and a result of simulation.

Further, assume that two close patterns as in FIG. 5 are repeated n number of times in the x direction and y direction, respectively. When the division is not carried out, 2*n*n patterns exist. As a result of performing the division for the correction of the mutual proximity effect as described above, 4*n*n patterns are obtained. If all are divided without using the present invention, however, the division becomes as shown in FIG. 6, the number of patterns becomes 18*n*n, and the amount of data is increased up to ten times. In a real device pattern, huge patterns not requiring correction of the proximity effect such as pads, light shielding bands, etc. exist, but if a simple division of all patterns is carried out without the use of the present invention, an enormous increase of the number of patterns is uselessly induced. Further, concerning the data processing time, the number of figures in a mesh determines the proximity effect correction time. This is because the contributions of all figures in the distance R which the proximity effect reaches become covered by the calculation. Where the present embodiment is not used, the time for one correction in a mesh is proportional to $18*n*n/R**2$, but by using the present embodiment, a time for calculation of correction proportional to $4*n*n/R**2$ is satisfactory.

SECOND EMBODIMENT

In the second embodiment, the correction processing is carried out similar to the first embodiment except the mutual proximity correcting means 10 and the self proximity correcting means 12 shown in FIG. 2 are used for the correction for the light proximity effect when performing exposure by using a photomask. Note that, the size of the mesh where it is used for the correction for the light proximity effect is within the range where for example the light at the exposure interferes. Namely, when the distance which the proximity effect reaches is defined as R, the pattern data is registered in a mesh of the size of R. The size of the mesh in one example is about 5 to 10 μm.

This will be explained in detail below.

First, an explanation will be made of the edge correction which is a prerequisite of the embodiment based on FIGS. 7 and 8.

At step S10 shown in FIG. 7, after the design pattern and the transfer conditions are input, at step S11, a plurality of evaluation points are prepared along the outer periphery of the design pattern.

Next, at step S12 shown in FIG. 7, a transfer resist pattern (transfer image) is calculated by the simulating means. As the simulating means, a commercially available light intensity simulation apparatus which can simulate the transfer image by receiving as input for example the exposure conditions and the design pattern can be used.

Next, at step S13 shown in FIG. 7, a deviation (difference) of the resist edge with respect to the design pattern is calculated for each evaluation point 30. The direction of measurement of the deviation of the resist edge position of the design pattern at this time is made a direction orthogonal to the boundary line of the design pattern 32 (edge: short side of the fine rectangular pattern in this case) as shown in FIG. 8A, the outward direction of the design pattern 32 is made the positive direction, and the inward direction thereof is made the negative direction.

Next, at step S14 shown in FIG. 7, the design pattern 32 is deformed and corrected by the deforming means 14 shown in FIG. 2 depending upon the deviation (difference) compared for every evaluation point 30 so that the difference becomes smaller. A schematic view of the deformation correcting method is shown in FIG. 8B.

As shown in FIGS. 8A and 8B, at the time of correction of the deformation of the design pattern 32, the boundary line of the mask pattern in the vicinity of the evaluation point 30 (including not only the evaluation point, but also the boundary line near this) is moved in a reverse direction to the deviation (difference) compared for every evaluation point 30 in exactly an amount obtained by multiplying the magnitude of the difference by a constant coefficient. The coefficient is preferably larger than 0 and less than 1, and further preferably 0.10 to 0.50. When this coefficient is too large, the correction of deformation becomes excessive, and there is an apprehension that the transfer image will not become closer to the design pattern and conversely will become further different even by the repetition calculation mentioned later. Note that, it is also possible if the coefficient is constant at all evaluation points and different at a specific evaluation point.

Figure 9:
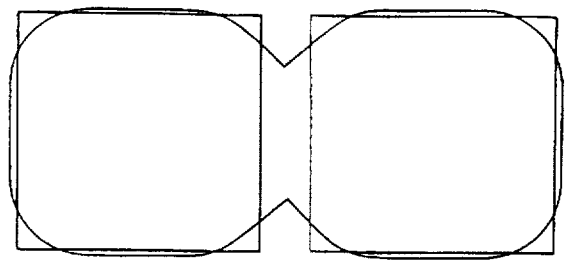
FIG. 9 is a view of a pattern requiring correction of the light proximity effect and the result of simulation.

Next, an explanation will be made of the mutual proximity correction at the time of exposure. As shown in FIG. 9, between close patterns of a fine interval corresponding to a 256 MDRAM, due to the interference of the stepper light, a mutual light proximity effect is generated and the final dimensions on the wafer becomes inferior.

Figure 10:
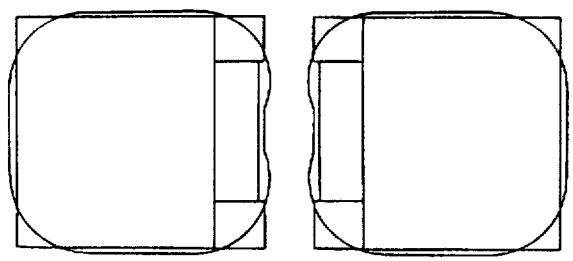
FIG. 10 is a view of a pattern as a result of performing the correction of the light proximity effect and the simulation result.

In the second embodiment, so as to prevent this light proximity effect, the adjoining sides of the patterns are divided and the edges are moved by using the means shown in FIGS. 7 and 8. The result thereof is shown in FIG. 10.

In the self proximity correction at time of exposure, it is possible if the procedure shown in for example FIGS. 7 and 8 is merely used.

Also, in the light proximity effect correction, the pattern division required is limited to the fine pattern ends and the side near the fine slit similar to Embodiment 1 etc.

Accordingly, by a searching method using mesh data similar to the first embodiment, the search of $n$ number of fine patterns can be carried out by $n$ number of searches. As a result of the searches, the adjoining portion for which the correction of the light proximity effect which was found is necessary can be divided. Accordingly, in the pattern repeated $n$ number of times in the two close XY directions corresponding to a 256 MDRAM, the number of divided patterns $18*n*n$ can be decreased to the number of divided patterns $4*n*n$ (refer to FIG. 10).

Further, concerning the data processing time, similar to the first embodiment, the number of figures in the mesh determines the time for correction of the light proximity effect. Where the present embodiment is not used, the time for one correction in a mesh is proportional to $18*n*n/R**2$, but by using the present embodiment, a time for calculation of correction proportional to $4*n*n/R**2$ is satisfactory.

Note that, the present invention is not limited to the above embodiments.

For example, in the above embodiments, as the light intensity simulation apparatus, a commercially available light intensity simulation apparatus with which the transfer image can be simulated by inputting the exposure conditions and the design pattern was used, but the present invention is not limited to this. Various simulation apparatuses can be used. For example, as the simulating means, it is also possible to adopt one having a means for calculating a two-dimensional light intensity on a substrate based on the design pattern and the exposure conditions, a means for calculating an influence by the light intensity at a plurality of peripheral positions on the exposure energy at any position to which attention is paid described before based on the light intensity at the peripheral position at any position on the two dimensional plane of the substrate to which attention was paid and a distance between the position to which attention was paid and the peripheral position and accumulating the same, thereby to calculate the latent image forming intensity at any position to which attention was paid on the two dimensional plane of the substrate, a means for finding the distribution of the latent image-forming intensity on the two-dimensional plane of the substrate, a means for determining the threshold value of the latent image-forming intensity corresponding to the amount of exposure and the development conditions, a means for finding a contour line at the threshold value for the distribution of the latent image-forming intensity, and a means for calculating the pattern defined by the contour line as the transfer image.

Further, as the simulating means, it is also possible to adopt aone having a means for simulating the transfer image under a plurality of transfer conditions based on the combination of a plurality of amounts of exposure of a preliminarily set exposure margin and a plurality of focus positions within a range of a preliminarily set focus depth, respectively, and obtaining a plurality of transfer images, a means wherein a comparing means compares the difference of each of the plurality of transfer images from the design pattern for every above evaluation point, calculating a plurality of differences for every evaluation point, and a means where a deforming means deforms the design pattern so that a plurality of differences for every evaluation point become smaller with a predetermined reference.

As explained above, in the present invention, in the production of a semiconductor integrated circuit pattern, by performing the minimum limit of division processing making the correction most effective in accordance with the proximity effect of the EB lithography and the light proximity effect of the result of wafer transfer, a finely processed mask and wafer can be prepared while suppressing the time for calculation of correction, drawing time, and data size and without a reduction of the thruput of preparation of the photomask.

While the invention has been described by reference to specific embodiments chosen for purposes of illustration, it should be apparent that numerous modifications could be made thereto by those skilled in the art without departing from the basic concept and scope of the invention.

What is claimed is:

1. A method of correcting pattern data for drawing a photomask comprising the steps of:

preparing mesh-registered pattern data by dividing a design pattern into meshes having a size within a scattering range of an energy beam emitted when drawing an image and registering the pattern encompassed by the mesh;

determining whether or not another pattern is registered in the periphery of the pattern registered for the mesh by designating a center for the mesh and searching inside the mesh and the mesh periphery; and correcting for mutual proximity effect when a periphery pattern is detected in said determining step and said detected periphery pattern is determined to cause mutual proximity effect at the time of drawing, said correcting step including subdividing only parts of the pattern causing the mutual proximity effect and assigning dosage amount data to the respective subdivided patterns to be used in drawing said image.

2. A method of correcting pattern data for drawing a photomask comprising the steps of:

preparing mesh-registered pattern data by dividing a design pattern into meshes having a size within a scattering range of an energy beam emitted when drawing an image and registering the pattern encompassed by the mesh;

determining whether or not another pattern is registered in the periphery of the pattern registered for the mesh by designating a center for the mesh and searching inside the mesh and the mesh periphery; and correcting for self proximity effect when no periphery pattern is detected in said determining step and self proximity effect is determined to occur at the time of drawing, said correcting step including subdividing only parts of the pattern causing the self proximity effect and assigning dosage amount data to the respective subdivided patterns to be used in drawing said image.

3. A method of correcting pattern data for drawing a photomask comprising the steps of:

preparing mesh-registered pattern data by dividing a design pattern into meshes having a size within a range of light proximity effect at the time of exposure in transferring an image of the photomask onto a substrate and registering the pattern encompassed by the mesh;

determining whether or not another pattern is registered in the periphery of the pattern registered for the mesh by designating a center for the mesh and searching inside the mesh and the mesh periphery and correcting for mutual proximity effect when a periphery pattern is detected in said determining step and said detected periphery pattern is determined to cause mutual light proximity effect at the time of exposure, said correcting step including subdividing only parts of the pattern causing the mutual light proximity effect and moving the edges of the subdivided patterns so that the image becomes closer to the design pattern.

4. A method of correcting pattern data for drawing a photomask comprising the steps of:

preparing mesh-registered pattern data by dividing a design pattern into meshes having a size within a range of light proximity effect at the time of exposure in transferring an image of the photomask onto a substrate and registering the pattern encompassed by the mesh;

determining whether or not another pattern is registered in the periphery of the pattern registered for the mesh by designating a center for the mesh and searching inside the mesh and the mesh periphery; and correcting for self proximity effect when no periphery pattern is detected in said determining step and self light proximity effect is determined to occur at the time of exposure, said correcting step including subdividing peripheral portions of the pattern in which the self light proximity effect is determined to occur and moving the edges of the subdivided patterns so that the image becomes closer to the design pattern.

* * * * *